(12) United States Patent
Troy et al.

(10) Patent No.: US 10,831,946 B2
(45) Date of Patent: Nov. 10, 2020

(54) MULTI-CONFIGURATION MASSIVE MODEL SYSTEM

(71) Applicant: The Boeing Company, Chicago, IL (US)

(72) Inventors: James J. Troy, Issaquah, WA (US); Michael Patrick Sciarra, Seattle, WA (US); Nikoli E. Prazak, Renton, WA (US); Steven E. Malarkey, Lynnwood, WA (US); Vladimir Karakusevic, Kirkland, WA (US); Robert Allan Brandt, Lake Stevens, WA (US); James E. Fadenrecht, Everett, WA (US)

(73) Assignee: The Boeing Company, Chicago, IL (US)

( * ) Notice: Subject to any disclaimer, the term of this patent is extended or adjusted under 35 U.S.C. 154(b) by 680 days.

(21) Appl. No.: 15/488,920

(22) Filed: Apr. 17, 2017

(65) Prior Publication Data

US 2018/0300446 A1 Oct. 18, 2018

(51) Int. Cl.
*G06G 7/48* (2006.01)
*G06F 30/15* (2020.01)
*G06F 16/22* (2019.01)

(52) U.S. Cl.
CPC .............. *G06F 30/15* (2020.01); *G06F 16/22* (2019.01)

(58) Field of Classification Search
CPC .............................. G06F 17/5095; G06F 16/22

USPC ............................................................ 703/8
See application file for complete search history.

(56) References Cited

U.S. PATENT DOCUMENTS

| | | | |
|---|---|---|---|
| 5,983,251 A * | 11/1999 | Martens | H04N 19/186 375/E7.083 |
| 9,898,682 B1 * | 2/2018 | Sieracki | G06K 9/4671 |
| 2009/0083738 A1 * | 3/2009 | Kruglick | G06F 16/24564 718/100 |

OTHER PUBLICATIONS (Real Time Interactive Massive Model Visualization, pp. 1-171). (Year: 2006).*

(Continued)

*Primary Examiner* — Andre Pierre Louis
(74) *Attorney, Agent, or Firm* — Yee & Associates, P.C.

(57) ABSTRACT

A multi-configuration massive model system. The system comprises a processor unit and a comparator configured to run on the processor unit, a memory, and a configuration manager. The comparator compares sets of parts for two or more configurations of a vehicle to form a list comprising a group of common parts and a group of unique parts. The memory is configured to store a massive model dataset of the configurations of the vehicle with a list of the group of common parts and the group of unique parts for the configurations of the vehicle. The configuration manager, configured to run on the processor unit, receives input of a selected configuration and performs an action relating to the vehicle using the massive model dataset for the selected configuration of the vehicle with the list of the group of common parts and the groups of unique parts stored in the memory.

27 Claims, 10 Drawing Sheets

(56) References Cited

OTHER PUBLICATIONS

Gobbetti et al., "Technical Strategies for Massive Model Visualization," Proceedings of the 2008 ACM Symposium on Solid and Physical Modeling, Stony Brook, New York, SPM, copyright 2008, pp. 405-415.

Yoon et al., "Real-Time Massive Model Rendering," Synthesis Lectures on Computer Graphics and Animation, copyright 2008, Morgan & Claypool Publishers, 122 pages.

* cited by examiner

| | 308 | 310 | 312 |
|---|---|---|---|
| 300 | MAJOR MODEL | MINOR MODEL | LINE NUMBER |
| 302 | 787 | -8 | ZA001-ZA999 |
| 304 | 787 | -9 | ZB001-ZB999 |
| 306 | 787 | -10 | ZC001-ZC999 |

| | 420 | 422 | 424 | 426 | 428 |
|---|---|---|---|---|---|
| 400 | MajorModel | MinorModel | Customer | AssignedBlock | ImplementedBlock |
| 402 | 787 | 8 | TD | ZA175-ZA194 | ZA189 |
| 404 | 787 | 8 | TD | ZA195-ZA209 | ZA204 |
| 406 | 787 | 9 | TD | ZB021-ZB021 | ZB021 |
| 408 | 787 | 9 | TD | ZB022-ZB026 | ZB026 |
| 410 | 787 | 9 | TD | ZB422-ZB423 | ZB423 |
| 412 | 787 | 9 | TD | ZB424-ZB438 | ZB426 |

MULTI-CONFIGURATION MASSIVE MODEL SYSTEM

BACKGROUND INFORMATION

1. Field

The present disclosure relates generally to manufacturing and, in particular, to a method and apparatus for manufacturing vehicles using a multi-configuration massive model system.

2. Background

In manufacturing aircraft, large three-dimensional model datasets, referred to here as massive model datasets, are used to display three-dimensional models of an aircraft to users. A massive model dataset is a collection of three-dimensional models in vehicles such as aircraft. The massive model datasets may have a myriad of models for thousands to millions of parts for the vehicle.

The display of these massive model datasets is often referred to as massive model visualization (MMV). For example, a user may visualize different configurations of an aircraft in which these configurations are displayed using a massive model dataset of the aircraft of interest. Different options may be selected to display how different configurations would look.

Further, the massive model datasets are also used in the manufacturing process for aircraft. With massive model datasets, visualization of the progress of the aircraft may be made to more effectively communicate information to engineers, managers, or other human operators involved in the manufacturing process.

For example, the assemblies in an aircraft may be displayed in a manner to show the state of assemblies for the aircraft at different times, as well as the current state of the aircraft. With this display, the human operator may quickly obtain an understanding of the assembly progress for a particular aircraft on a line.

Further, the massive model datasets may be displayed to show the state of work orders for different assemblies. For example, the aircraft may be displayed with color coding or other graphic indicators to indicate the state of work orders for different assemblies. For example, color coding displayed with the assemblies to indicate the state of work orders, such as on time, delayed, completed, in progress, or other states.

Massive model dataset creation is processor intensive involving precompiling datasets for each configuration of an aircraft. For example, if creating a massive model dataset takes one hour, ten configurations takes ten hours of processing time.

Additionally, each of these massive model datasets are sent over a network to a computer station for display. Sending ten massive model datasets increases the amount of bandwidth needed on the network to transmit the different configurations to a workstation by a factor of ten. In addition to processing resources and the bandwidth used to transmit the massive model datasets, these massive model datasets also require large amounts of storage space.

Thus, as the number of configurations increase, the resources needed for the increased number of massive model datasets increases. Therefore, it would be desirable to have a method and apparatus that take into account at least some of the issues discussed above, as well as other possible issues. For example, it would be desirable to have a method and apparatus that overcome problems associated with the amount of resources needed for using massive model datasets.

SUMMARY

An embodiment of the present disclosure provides for a multi-configuration massive model system. The multi-configuration massive model system comprises a processor unit and a comparator configured to run on the processor unit, a memory, and a configuration manager. The comparator compares sets of parts for two or more configurations of a vehicle to form a list comprising a group of common parts that are common to each of the configurations and a group of unique parts that are unique to each of the configurations. The memory is configured to store a massive model dataset of the configurations of the vehicle with a list of the group of common parts and the group of unique parts for the configurations of the vehicle. The configuration manager, configured to run on the processor unit, receives input of a selected configuration and performs an action relating to the vehicle using the massive model dataset for the selected configuration of the vehicle with the list of the group of common parts and the groups of unique parts stored in the memory.

Another embodiment of the present disclosure provides a method for managing a massive model dataset. The method uses a computer system to compare parts for configurations of a vehicle to form a list. The list comprises a group of common parts that are common to each of the configurations and a group of unique parts that are unique to each of the configurations. The method receives input of a selection of a particular configuration. The method preforms an action relating to a selected configuration of the vehicle using the massive model dataset with a list of the group of common parts and the group of unique parts.

Yet another embodiment of the present disclosure provides a product management system comprising a control system. The control system is configured to compare parts for configurations of a vehicle to a list of a group of common parts that are common to each of the configurations and a group of unique parts that are unique to each of the configurations. The control system receives input of a selection of a particular configuration and controls operation of at least one of a manufacturing system or a maintenance system using a group of datasets with a list of the group of common parts and the group of unique parts to perform an action relating to a vehicle for the selected configuration in the configurations.

The features and functions can be achieved independently in various embodiments of the present disclosure or may be combined in yet other embodiments in which further details can be seen with reference to the following description and drawings.

BRIEF DESCRIPTION OF THE DRAWINGS

The novel features believed characteristic of the illustrative embodiments are set forth in the appended claims. The illustrative embodiments, however, as well as a preferred mode of use, further objectives and features thereof, will best be understood by reference to the following detailed description of an illustrative embodiment of the present disclosure when read in conjunction with the accompanying drawings, wherein:

DETAILED DESCRIPTION

The illustrative embodiments recognize and take into account one or more different considerations. Those embodiments recognize and take into account that it would be desirable to reduce the amount of resources needed to store, access, and display different configurations of an aircraft in an efficient manner. For example, the illustrative embodiments recognize and take into account that determining common parts in different configurations may be used to reduce the amount of resources needed to create and display these configurations.

The illustrative embodiments provide a method and apparatus for managing massive model datasets. For example, a computer system compares parts for configurations of a vehicle to form a list of common parts and unique parts. The computer system, when running one or more processes in an illustrative example, determines a group of common parts that are common to each of the configurations from the comparison and a group of unique parts that are unique to each of the configurations from the comparison. An input of a selection of a particular configuration is received. The computer system performs an action relating to the selected configuration of the vehicle using the massive model dataset with the determination of the group of common parts and the group of unique parts.

The result is a massive model dataset that contains information for multiple configurations of a vehicle. In other words, the massive model dataset is not created for each configuration of vehicle. Instead, the different configurations are represented in the massive model dataset.

Figure 1:
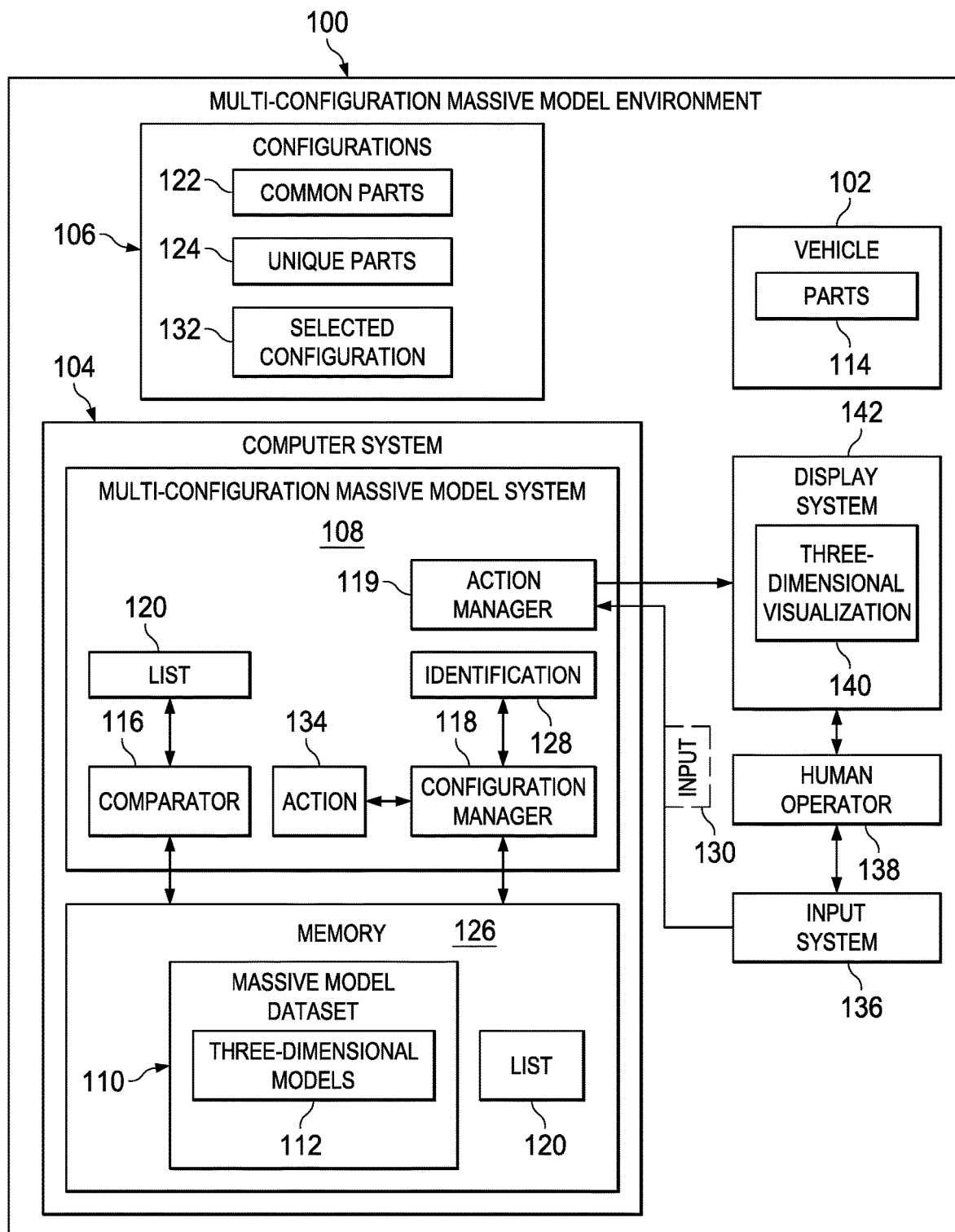
FIG. 1 is an illustration of a block diagram of a multi-configuration massive model environment in accordance with an illustrative embodiment.

With reference now to the figures, and in particular with reference to FIG. 1, an illustration of a block diagram of a multi-configuration massive model environment is depicted in accordance with an illustrative embodiment. As depicted, multi-configuration massive model environment 100 is an environment in which the displaying of vehicle 102 may be made using computer system 104.

In this illustrative example, vehicle 102 may take various forms. For example, vehicle 102 may be selected from a group comprising a mobile platform, an aircraft, an airplane, a rotorcraft, a surface ship, a tank, a personnel carrier, train, a spacecraft, a submarine, a bus, an automobile, and other suitable types of vehicles.

As depicted, computer system 104 is a physical hardware system and includes one or more data processing systems. When more than one data processing system is present, those data processing systems are in communication with each other using a communications medium. The communications medium may be a network. The data processing systems may be selected from at least one of a computer, a server computer, a tablet, or some other suitable type of data processing system.

In this illustrative example, vehicle 102 has configurations 106. Multi-configuration massive model system 108 is present in computer system 104, multi-configuration massive model system 108 is configured to manage massive model dataset 110 for configurations 106 for vehicle 102. Massive model dataset 110 includes three-dimensional models 112 needed to display vehicle 102. In this example, massive model dataset 110 may also be referred to as a multi-configuration massive model dataset because massive model dataset 110 contains information for more than one configuration.

In particular, three-dimensional models 112 represent parts 114 that may be present in vehicle 102. Each model in three-dimensional models 112 may represent a part or assembly parts.

Parts 114 may take various forms. For example, parts 114 may be selected from at least one of an assembly, a wheel, a wiring system, a spar, a wing box, a rib, a panel, a door, a cabinet, a monument, an engine housing, a flap, a light strip, a computer, an environmental control system, or some other suitable type of structure or system. The selection of what components form a part may depend on the desired granularity.

As used herein, the phrase "at least one of", when used with a list of items, means different combinations of one or more of the listed items may be used, and only one of each item in the list may be needed. In other words, "at least one of" means any combination of items and number of items may be used from the list, but not all of the items in the list are required. The item may be a particular object, a thing, or a category.

For example, without limitation, "at least one of item A, item B, or item C" may include item A, item A and item B, or item B. This example also may include item A, item B, and item C or item B and item C. Of course, any combinations of these items may be present. In some illustrative examples, "at least one of" may be, for example, without limitation, two of item A, one of item B, and ten of item C; four of item B and seven of item C; or other suitable combinations.

The selection of three-dimensional models 112 included in massive model dataset 110 is based on configurations 106 in this illustrative example. In other words, a unique massive model dataset is not created for each of configurations 106.

Multi-configuration massive model system 108 has a number of different components. As depicted, multi-configuration massive model system 108 includes comparator 116 and configuration manager 118. In the illustrative example, comparator 116 and configuration manager 118 operate as automated processes without requiring user input.

As depicted, comparator 116 is configured to compare sets of parts 114 for two or more configurations in configurations 106 of vehicle 102 to form list 120. In the illustrative example, list 120 is a list of common parts 122 and unique parts 124. In other illustrative examples, list 120 may include the data needed to determine the group of common parts 122 and the group of unique parts 124.

In comparing sets of parts 114, comparator 116 is also configured to determine a group of common parts 122 that are common to each of configurations 106 from list 120 and determine for each configuration a group of unique parts 124 that are unique to each of configurations 106 to form list 120. As depicted, list 120 is a list of common parts 122 and unique parts 124 for a configuration.

As used herein, a "group of" when used with reference to items is one or more items. For example, a group of unique parts 124 is one or more of unique parts 124.

Memory 126 in computer system 104 is configured to store massive model dataset 110 of configurations 106 of vehicle 102 with list 120 of the group of common parts 122 and the groups of unique parts 124 for configurations 106 of vehicle 102.

In this illustrative example, action manager 119 is configured to receive input 130 of selected configuration 132 in configurations 106 and perform action 134 relating to vehicle 102 using massive model dataset 110 for selected configuration 132 of vehicle 102 with list 120 of the group of common parts 122 and the group of unique parts 124 stored in memory 126.

Action 134 may take any number different forms. For example, action 134 may comprise initiating at least one of a manufacturing operation, a maintenance operation, manufacturing the part, replacing the part, inspecting the part, placing the configurations into groups for displaying a massive model dataset of the vehicle, or performing a cost analysis.

In this example, input 130 originates from input system 136 operated by human operator 138. Input system 136 is a physical hardware system and may be selected from at least one of a mouse, a keyboard, a trackball, a touchscreen, a stylus, a motion sensing input device, a cyber glove, or some other suitable type of input device.

As depicted, three-dimensional visualization 140 of selected configuration 132 may be presented on display system 142 as an example of action 134. Three-dimensional visualization 140 may be viewed by human operator 138 may in turn perform other operations based on viewing three-dimensional visualization 140.

In this example, action manager 119 is depicted as generating and displaying three-dimensional visualization 140 on computer system 104. In other illustrative examples, three-dimensional visualization 140 may be generated by other components, such as a computer aided display application that is in a separate system from multi-configuration massive model system 108. Those other components may be located on the same or different data processing system in computer system 104 from multi-configuration massive model system 108.

In this manner, action manager 119 may receive a user input selecting a particular configuration from configurations 106 and display massive model dataset 110 that includes common parts 122 that are common to each of configurations 106 and the group of unique parts 124 that are unique to selected configuration 132 of vehicle 102 on display system 142 using massive model dataset 110 with list 120 of the group of common parts 122 and the group of unique parts 124 for selected configuration 132 of vehicle 102.

In this illustrative example, the generation of three-dimensional visualization 140 includes the group of unique parts for the selected configuration, such that the three-dimensional visualization of the selected configuration is created without using, at the time of the selection, from a plurality of different configuration datasets, all of the part models for all of the parts for the selected configuration to be loaded as needed for display.

Multi-configuration massive model system 108 may be implemented in software, hardware, firmware or a combination thereof. When software is used, the operations performed by multi-configuration massive model system 108 may be implemented in program code configured to run on hardware, such as a processor unit. When firmware is used, the operations performed by multi-configuration massive model system 108 may be implemented in program code and data, and stored in persistent memory to run on a processor unit. When hardware is employed, the hardware may include circuits that operate to perform the operations in multi-configuration massive model system 108.

In the illustrative examples, the hardware may take a form selected from at least one of a circuit system, an integrated circuit, an application specific integrated circuit (ASIC), a programmable logic device, or some other suitable type of hardware configured to perform a number of operations. With a programmable logic device, the device may be configured to perform the number of operations. The device may be reconfigured at a later time or may be permanently configured to perform the number of operations. Programmable logic devices include, for example, a programmable logic array, a programmable array logic, a field programmable logic array, a field programmable gate array, and other suitable types of hardware devices.

In one illustrative example, one or more technical solutions are present that overcome a technical problem with the amount of resources needed for using massive model datasets. As a result, one or more technical solutions described in one or more illustrative examples provides a technical effect reducing the resources needed to create and display massive model datasets when multiple configurations are present in the same dataset.

In the illustrative examples, one or more technical solutions are present for building groups of massive model datasets based on groupings of configurations. These groupings may be present for multiple versions of aircraft or other types of vehicles. One or more of the solutions allow for multiple configurations to be represented in a single massive model dataset rather than having a separate massive model dataset for each version. The grouping may be made in different ways, such as customers, differences between configurations, manufacturing locations, manufacturing lines, and other types of groupings.

As a result, when computer system 104 executes multi-configuration massive model system 108, which includes comparator 116 and configuration manager 118, computer system 104 operates as a special purpose computer system in which multi-configuration massive model system 108 in computer system 104 enables managing multiple configurations for a vehicle using less resources. In particular, multi-configuration massive model system 108 transforms computer system 104 into a special purpose computer system as compared to currently available general computer systems that do not have multi-configuration massive model system 108.

As used herein, the terms "computer system," "comparator," "manager," "component," or "module" may include a hardware and/or software system that operates to perform one or more functions. For example, the comparator, manager, module, component, or system may include a computer processor, controller, or other logic-based device that performs operations based on instructions stored on a tangible and non-transitory computer readable storage medium, such as a computer memory. Alternatively, the comparator, manager, module, component, or system may include a hard-wired device that performs operations based on hard-wired logic of the device. The flowcharts, modules, or components shown in the attached figures may represent the hardware that operates based on software instructions and hardware logic, the software that directs hardware to perform the operations, or a combination thereof.

Currently, a configuration dataset is created for each configuration of a vehicle, such as an aircraft. In other words, a configuration dataset stores all of the models needed for a particular configuration of an aircraft. This configuration dataset also includes a listing of parts and subassemblies. This list may also include mappings to computer-aided design files. Each configuration of an aircraft has its own configuration dataset that is created. As a result, processing time is incurred for each configuration, as well as bandwidth and memory use.

In contrast, the one or more of the technical solutions uses a single massive model dataset with common parts between the configurations, as well as unique parts for each of the configurations. The models included in the single massive model dataset include models that cover all of the common parts, as well as unique parts for each of the configurations. As a result, less processor resource time, less bandwidth, and less memory are needed to represent multiple configurations of the vehicle.

Figures 2, 3, 4:
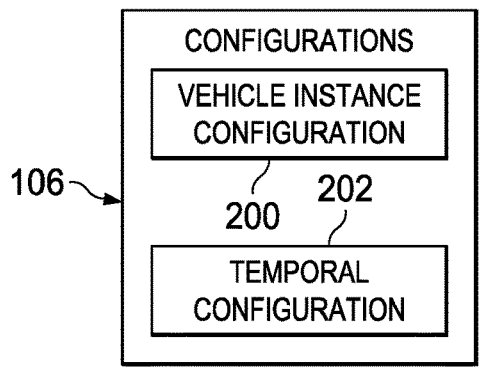
FIG. 2 is an illustration of a block diagram of configurations in accordance with an illustrative embodiment.
FIG. 3 is an illustration of a high-level grouping block in accordance with an illustrative embodiment.
FIG. 4 is an illustration of a tabulation block in accordance with an illustrative embodiment.

With reference to FIG. 2, an illustration of a block diagram of configurations is depicted in accordance with an illustrative embodiment. In this figure, configurations 106 includes at least one of vehicle instance configuration 200 or temporal configuration 202.

When configurations 106 take the form of vehicle instance configuration 200, vehicle instance configuration 200 is a different variation of a major model of vehicle 102, shown in FIG. 1. For example, vehicle instance configuration 200 may be for a specific line number of vehicle 102. In other words, different ones of configurations 106 may have different options or parts, as compared to other versions of vehicle 102 in other ones of configurations.

For example, the group of common parts 122 shown in FIG. 1, may be those parts for a model of an aircraft, such as a Boeing 787 Dreamliner. This model may also be referred to as a major model for the aircraft. The group of unique parts may be, for example, a minor model type, an airline customer package, options selected, or other differences from a major model.

As another example, a configuration of vehicle 102 may be displayed using configurations 106 in the form of temporal configuration 202. In other words, the same vehicle instance may be displayed at different points in time during the manufacturing of vehicle 102. These points may be actually completed stages of manufacturing or projected stages of manufacturing for vehicle 102. This temporal difference may also be for different stages of maintenance of vehicle 102 through the lifespan of the vehicle.

For example, with temporal configuration 202, different configurations or updated versions of the same line number of an aircraft from different points in time may be selected. At run-time, users can then select which version of the three-dimensional model dataset is displayed.

Further, configurations 106 may include a combination of vehicle instance configuration 200 and temporal configuration 202. For example, multiple vehicles for different line numbers may be present for different points in time in configurations 106.

With reference now to FIG. 3, an illustration of a high-level grouping block is depicted in accordance with illustrative embodiment. In this illustrative example, high-level grouping block 300 is an example of a selection of some configurations that may be used for configurations 106, shown in FIG. 1 and FIG. 2. In other words, configurations 106 may not be all of the configurations for vehicle 102, shown in FIG. 1. High-level grouping block 300 is used to pre-group some configurations to form configurations 106. In other words, configurations 106 may be a pre-grouping of a larger set of configurations.

In this illustrative example, high-level grouping block 300 groups configurations by major model. As depicted, high-level grouping block 300 includes configuration 302, configuration 304, and configuration 306. Each configuration is identified in the columns of major model 308 and then by minor model 310 and effectivity block 312.

The minor model 310 is a variation of a major model. Effectivity block 312 is a range of line numbers. Each line number is an instance of a vehicle.

With reference next to FIG. 4, an illustration of a tab block is depicted in accordance with an illustrative embodiment. As depicted, tabulation block 400 are example of some configurations in configurations 106 in FIG. 1. In tabulation block 400, the configurations are grouped by the customer. Tabulation blocks are groups of aircraft that have a similar configuration for a specific minor model.

In this example, tabulation block 400 includes configuration 402, configuration 404, configuration 406, configuration 408, configuration 410, and configuration 412. These configurations in tabulation block 400 may also be referred to as "lots".

Each configuration is identified in the columns as follows: major model 420, minor model 422, customer 424, assigned block 426, and implemented block 428. In this example, Major model 420 is a model of an aircraft. Minor model 422 is a variation on a major model of the aircraft. Customer 424 is the code identifying a customer for whom the aircraft will be delivered. Assigned block 426 is identifier for a group of proposed production configurations. In this example, a range of line numbers are shown. Implemented block 428 is an identifier for a group of committed production configurations.

The grouping of configurations in FIG. 3 and FIG. 4 are pre-defined groupings or lists as shown in these figures. Using a pre-defined grouping of configurations may further reduce the amount of processing needed for the configurations.

The illustration of multi-configuration massive model environment 100 and the different components in FIGS. 1-4 are not meant to imply physical or architectural limitations to the manner in which an illustrative embodiment may be implemented. Other components, in addition to or in place of the ones illustrated, may be used. Some components may be unnecessary. Also, the blocks are presented to illustrate some functional components. One or more of these blocks may be combined, divided, or combined and divided into different blocks when implemented in an illustrative embodiment.

For example, only massive model dataset 110 is present for configurations 106. In other illustrative examples, one or more massive model datasets, in addition to massive model dataset 110, may be created for configurations 106. More than one massive model dataset may be present depending on how similar configurations 106 are to each other. For example, configurations 106 may be divided into two or more groups, for which each group has a massive model dataset with its own common parts and unique parts.

As another example, configurations 106 are shown as being separate from massive model dataset 110, common parts 122, and unique parts 124 stored in memory 126. Configurations 106 may be included as part of massive model dataset 110 in some illustrative examples. As yet another example, input 130 may be generated by another operator rather than human operator 138. For example, the operator may be a computer or other data processing system that runs program code to generate input 130.

In yet another illustrative example, configuration manager 118 may be split into different components to perform the different functions described. For example, configuration manager 118 may generate list 120 identifying a group of common parts 122 in a group of unique parts 124. Another component may perform the function of receiving input 130 and performing action 134.

Figure 5:
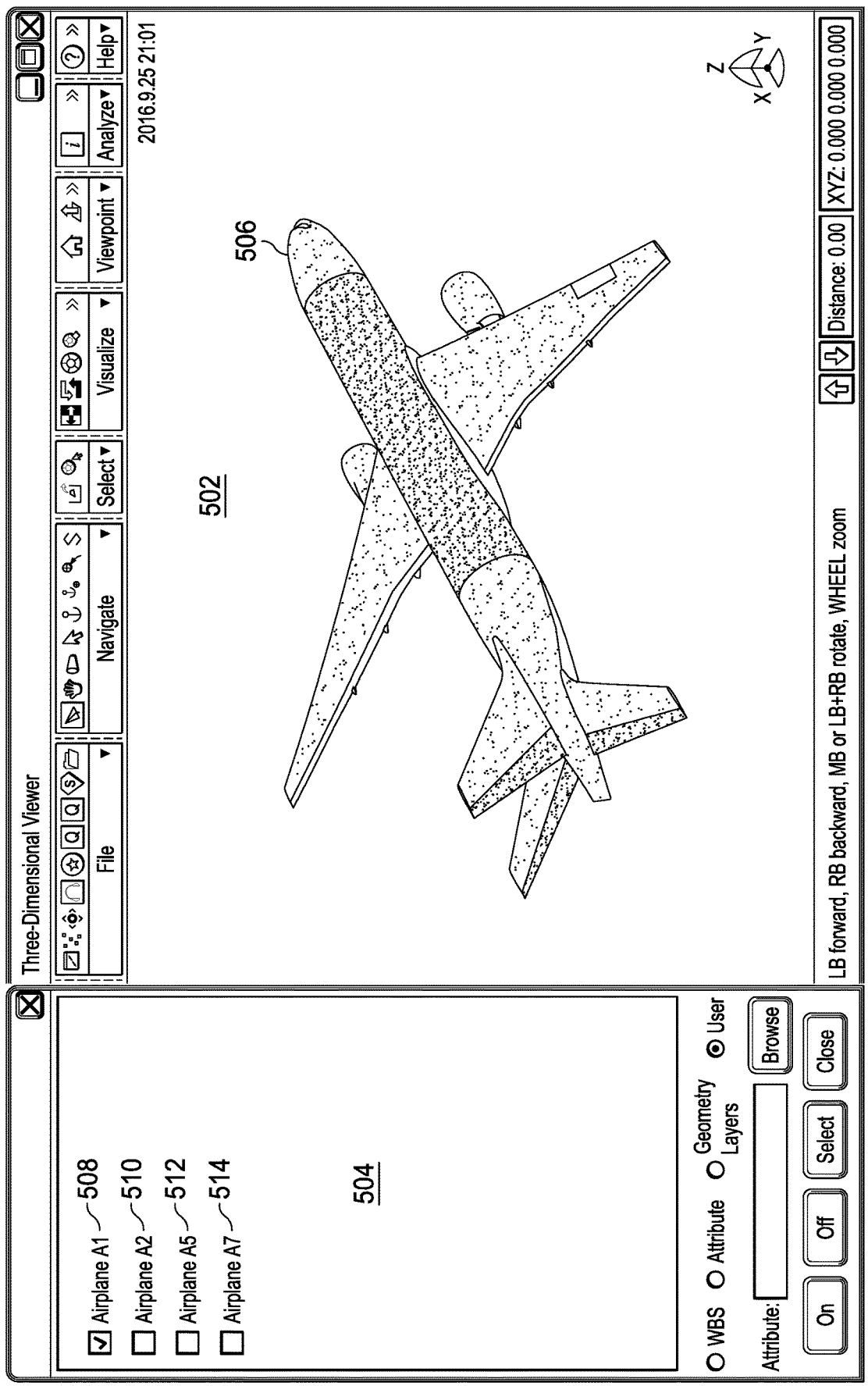
FIG. 5 is an illustration of a three-dimensional visualization of a vehicle in accordance with an illustrative embodiment.

With reference to FIG. 5, an illustration of a three-dimensional visualization of a vehicle is depicted in accordance with an illustrative embodiment. As depicted, three-dimensional visualization 500 is an example of one manner in which three-dimensional visualization 140 may be displayed on display system 142 by computer system 104 using multi-configuration massive model system 108 shown in block form in FIG. 1. Three-dimensional visualization 500 is a run-time visualization interface for displaying the massive model dataset that has been previously determined and generated.

In this illustrative example, three-dimensional visualization 500 includes vehicle section 502 and configuration section 504. Vehicle section 502 displays airplane 506 which is an example of one of implementation for vehicle 102 shown in block form in FIG. 1. In this example, airplane 506 is displayed using a massive model dataset.

As depicted, a massive model dataset is present for four configurations of airplane 506. In this illustrative example, the four configurations are airplane A1 508, airplane A2 510, airplane A5 512, and airplane A7 514.

In this depicted example, airplane A1 508 has been selected and is displayed in vehicle section 502. The display of airplane A1 508 is made from a massive model dataset with common parts previously determined to be common between the four configurations. In other words, the determination of the common parts is made as part of creating the massive model dataset. This process is performed ahead of time to reduce the time needed to display airplane A1 508. The models for those common parts in the list stored with the massive model dataset are displayed in vehicle section 502 as those different parts are seen in the view of airplane 506 in vehicle section 502. In some illustrative examples, the massive model data set is displayed using viewpoint information to determine which models or parts of models will be displayed.

Additionally, unique parts for airplane A1 508 are identified and marked in an enabled state for display in vehicle section 502. The determination of unique parts is made prior to the massive model dataset being made available to display airplane A1 508 in this example. In other words, the unique parts are located in the list that may be used with the massive model dataset to display airplane A1 508. The models for the unique parts that are enabled are displayed in vehicle section 502 as those parts are seen by the human operator. Thus, as the human operator rotates, selects, flies through, or performs other actions that change the view, additional models for common parts and enabled unique parts are displayed in vehicle section 502.

In this illustrative example, another configuration is selected. For example, airplane A5 512 is selected for display. Selection of this configuration results in the unique parts for airplane A1 508 being marked as disabled. As a result, any models being displayed for unique parts of a disabled state are removed from vehicle section 502. The state for unique parts for airplane A5 512 are marked as enabled. As a result, those unique parts are displayed in vehicle section 502 when they can be seen by a human operator.

The illustration of three-dimensional visualization 500 is only shown as one manner in which three-dimensional visualization 140 may be implemented and is not meant to limit the manner in which other visualizations maybe presented to the human operator.

For example, other types of graphical indicators other than text may be used to indicate different configurations for the airplane. As another example, other types of vehicles also may be displayed such as a rotorcraft, a spacecraft, a submarine, or other suitable types of vehicles.

In this manner, a massive model dataset may be used for these four configurations instead of having four configuration datasets for each of the configurations. As a result, the reduction in the amount of processing resources needed to create the massive model dataset as compared to configuration datasets increases when the number of configurations increases. Further, the bandwidth needed to transmit data to display the different configurations and the storage needed for the data for the different configurations are also decreased using a multi-configuration massive model system in the depicted examples.

Figure 6:
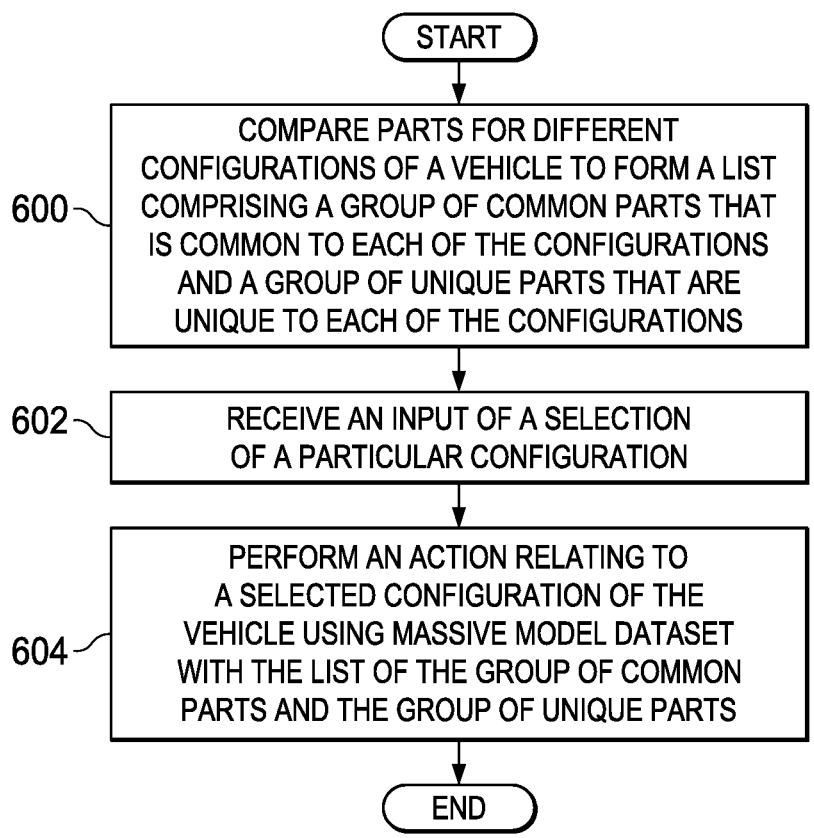
FIG. 6 is an illustration of a flowchart of a process for managing a massive model dataset in accordance with an illustrative embodiment.

Turning next to FIG. 6, an illustration of a flowchart of a process for managing a massive model dataset is depicted in accordance with an illustrative embodiment. The process illustrated in FIG. 6 may be implemented in multi-configuration massive model system 108 in FIG. 1. The different operations may be implemented as program code that is run by one or more processor units in computer system 104 in FIG. 1. The processor units may be in the same data processing system or different data processing systems, depending on the implementation.

The process illustrated in FIG. 6 may be implemented in multi-configuration massive model system 108 in FIG. 1. The different operations may be implemented as program code that is run by one or more processor units in computer system 104 in FIG. 1. The processor units may be in the same data processing system or different data processing systems, depending on the implementation. This process is not performed in runtime when the vehicle is displayed.

The process begins by comparing parts for configurations of a vehicle to form a list comprising a group of common parts that are common to each of the configurations and a group of unique parts that is unique to each of the configurations (operation 600). Operation 600 may be performed by determining a group of common parts that are common to each of the configurations and then determining a group of unique parts that are unique to each of the configurations.

In operation 600, the determination of the group of common parts is based on common part geometries for the parts, and a location definition identifying a location of each instance of the common part geometries. The location definition may be for example, a transformation matrix, Euler parameters, quaternions, or some other mechanism that defines the three-dimensional position and orientation of a part relative to a reference coordinate system.

The process receives an input of a selection of a particular configuration (operation 602). The process performs an action relating to the selected configuration of the vehicle using the massive model dataset with the list of the group of common parts and the group of unique parts (operation 604). The process terminates thereafter.

Figure 7:
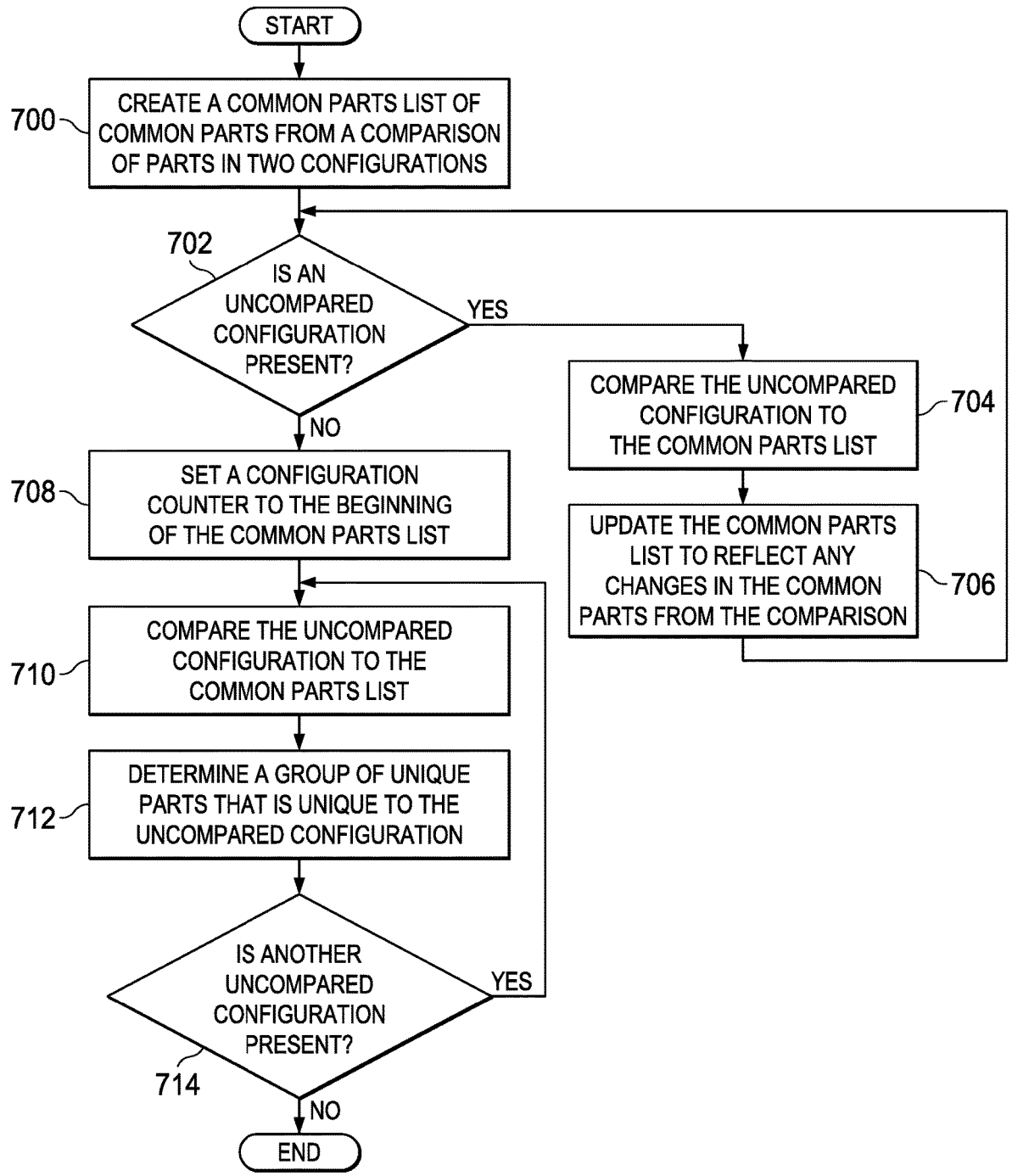
FIG. 7 is an illustration of a flowchart of a process for determining common and unique parts in accordance with an illustrative embodiment.

With reference next to FIG. 7, an illustration of a flowchart of a process for determining common and unique parts is depicted in accordance with an illustrative embodiment. The process illustrated in FIG. 7 is an example of one implementation for operation 602 and operation 604 in FIG. 6.

The process begins by creating a common parts list of common parts from a comparison of parts in two configurations (operation 700). The process determines whether an uncompared configuration is present (operation 702). If an uncompared configuration is present, the process compares the uncompared configuration to the common parts list (operation 704).

The process then updates the common parts list to reflect any changes in the common parts from the comparison (operation 706). The process returns to operation 702.

Essentially, operations 702 through 706 sequentially compare the common parts list to another configuration in the remaining configurations to be compared and update the common parts list of common parts until all of the configurations have been compared.

In operation 702, if an uncompared configuration is not present, the process sets a configuration counter to the beginning of the common parts list (operation 708). The uncompared configuration is compared to the common parts list (operation 710). A group of unique parts that is unique to the uncompared configuration is determined (operation 712). The group of unique parts may be placed into a unique parts list for the configuration. Each configuration would have its own unique parts list.

Next, a determination is made as to whether another uncompared configurations present (operation 714). If another un-compared configuration is present, the process returns to operation 710. Otherwise, the process terminates. In this manner, operations 710 through 714 compare parts for each of the configurations to the common parts list to create the groups of unique parts that are unique to each of the configurations.

As a result, the common parts list plus the group of unique parts form the information needed for a particular configuration. The process in this flowchart involves 2*n−1 file comparisons (i.e. O(n)). This means that the process scales linearly with the number of model lists. This process provides a more efficient processing approach than an exhaustive set-to-set comparison, which would involve n*(n−1)/2 comparisons (i.e. O(n²)).

Thus, the process in FIG. 7 determines the common elements shared between configurations and the elements that are unique to each of the configurations. In general, the storage space savings is equal to the size of the common parts in the massive model dataset times the number of configurations that share those common parts. In other words, in contrast to multiple independent massive model datasets as currently utilized for multiple configurations (where each independent dataset contains a single configuration), a single dataset is present in the form of a massive model dataset that includes multiple configurations.

Figure 8:
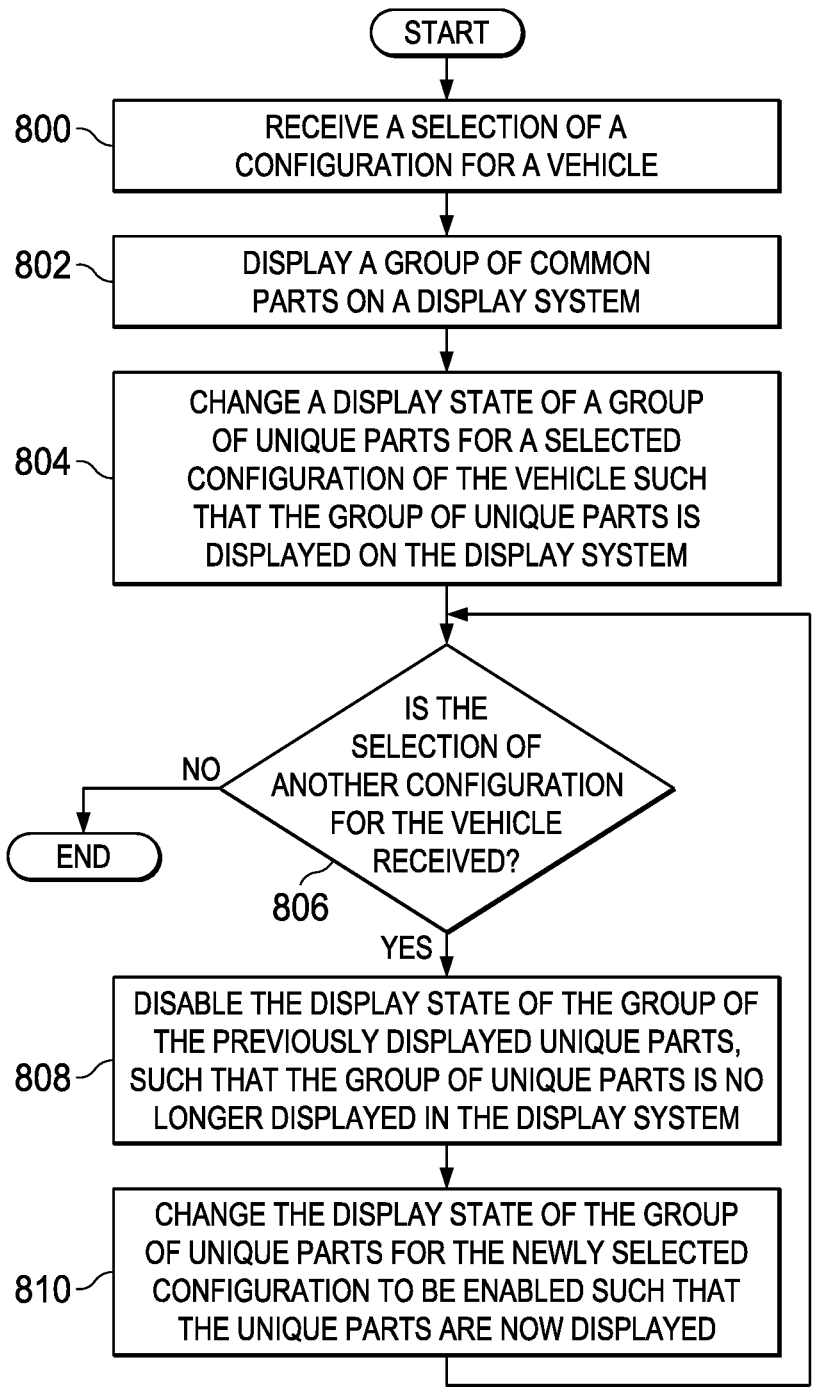
FIG. 8 is an illustration of a flowchart of a process for displaying a configuration of an aircraft in accordance with an illustrative embodiment.

With reference now to FIG. 8, an illustration of a flowchart of a process for displaying a configuration of an aircraft is depicted in accordance with an illustrative embodiment. Process illustrated FIG. 8 may be implemented in multi-configuration massive model system 108 in FIG. 1 to show three-dimensional visualization 140 on display system 142 in FIG. 1. The different operations may be implemented as program code that is run by one or more processor units in computer system 104 in FIG. 1. The processor units may be in the same data processing system or different data processing systems, depending on the implementation. This process uses massive model dataset 110, the group of common parts 122, and the group of unique parts 124 for selected configuration 132 shown in FIG. 1.

The process begins by receiving a selection of a configuration for a vehicle (operation 800). The process displays a group of common parts on a display system (operation 802). The process changes a display state of a group of unique parts for a selected configuration of the vehicle such that the group of unique parts is displayed on the display system (operation 804).

At this point, the group of common parts and the group of unique parts for the selected configuration are displayed. As a result, the configuration of the vehicle is now displayed.

The process determines whether the selection of another configuration for the vehicle is received (operation 806). If the selection of another configuration is received, the display state of the group of the previously displayed unique parts is disabled such that the group of unique parts is no longer displayed in the display system (operation 808). The process changes the display state of the group of unique parts for the newly selected configuration to be enabled such that the unique parts are now displayed (operation 810).

The next configuration or vehicle is now displayed. With this process, loading models from another dataset and re-displaying those models is avoided. Instead, the common parts list are still displayed and the display state of the unique parts is enabled and disabled as needed for different configurations, enabling reducing the amount of resources needed to display different configurations of the vehicle. The process then returns to operation 806. In operation 806, if the selection of another configuration is not received, the process terminates.

Figure 9:
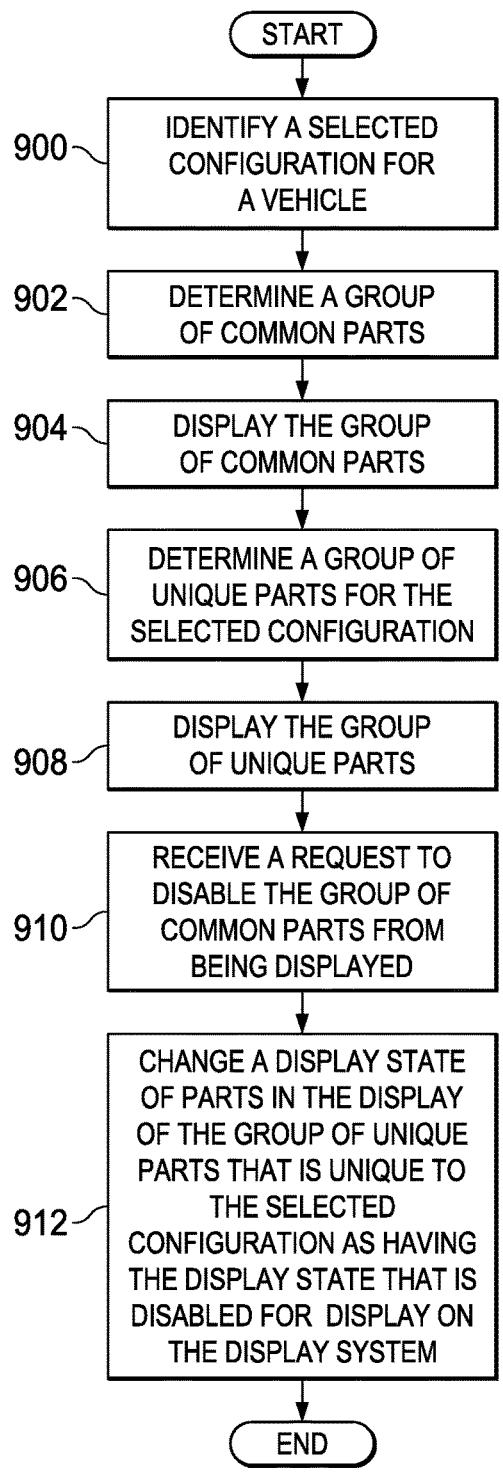
FIG. 9 is an illustration of a flowchart of a process for displaying a configuration of an aircraft in accordance with an illustrative embodiment.

With reference now to FIG. 9, an illustration of a flowchart of a process for displaying a configuration of an aircraft is depicted in accordance with an illustrative embodiment. The process in this figure illustrates displaying a massive model dataset after the massive model dataset has been created with lists of common parts and unique parts for different configurations of a vehicle. The process illustrated FIG. 9 may be implemented in action manager 119 in multi-configuration massive model system 108 to show three-dimensional visualization 140 on display system 142 in FIG. 1.

The process begins by identifying a selected configuration for a vehicle (operation 900). The process determines a group of common parts (operation 902). In operation 902, this group of common parts may be determined from a common parts list of common parts that are associated with the selected configuration. The process displays the group of common parts (operation 904).

The process determines a group of unique parts for the selected configuration (operation 906). The group of unique parts also may be associated with the selected configuration. The process displays the group of unique parts (operation 908). With the three-dimensional visualization of the group of common parts and the group of unique parts, the display of the selected configuration for the vehicle on a display system is now complete.

The process then receives a request to disable the group of common parts from being displayed (operation 910). The process changes a display state of parts in the display of the group of unique parts that is unique to the selected configuration as having the display state that is disabled for display on the display system (operation 912). The process terminates thereafter.

Figure 10:
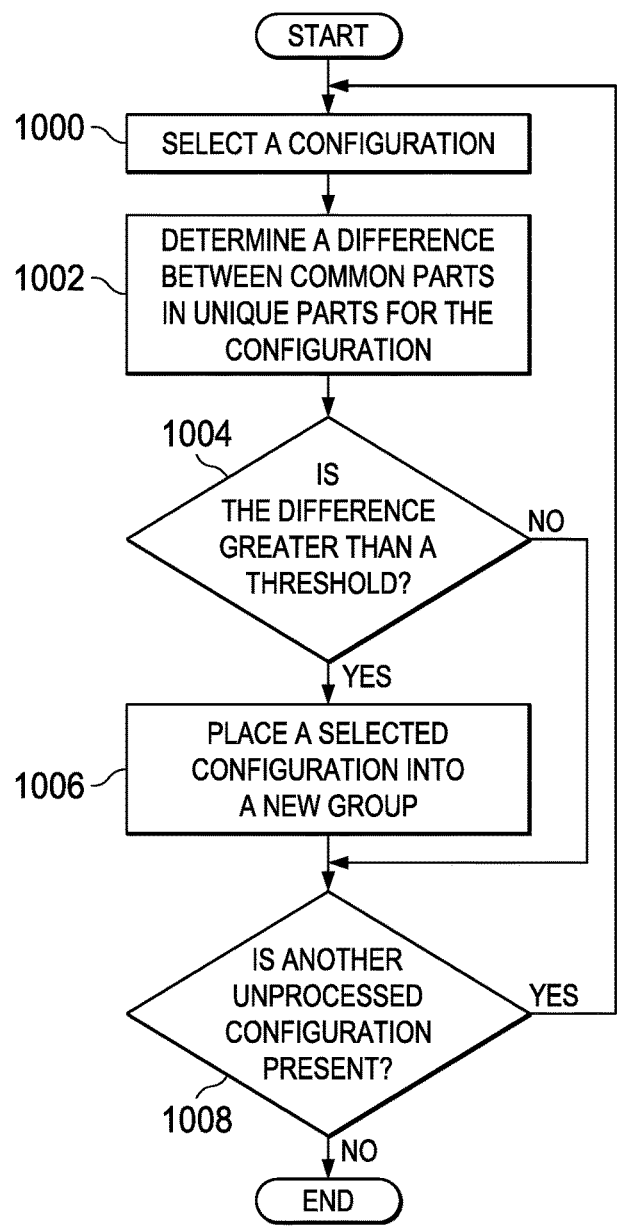
FIG. 10 is an illustration of a flowchart of a process for analyzing configurations in accordance with an illustrative embodiment.

With reference next to FIG. 10, an illustration of a flowchart of a process for analyzing configurations is depicted in accordance with an illustrative embodiment. The process illustrated in FIG. 10 may be implemented in configuration manager 118 in multi-configuration massive model system 108 in FIG. 1. This process may be implemented to determine whether a group of configurations should be two or more groups of configurations. This process is performed ahead of time prior to visualization of a massive model data set The process begins by selecting a configuration (operation 1000). The process determines a difference between common parts in unique parts for the configuration (operation 1002). In operation 1002, the difference is a percentage indicating how close the configuration is to the parts in the common parts list.

A determination is made as to whether the difference is greater than a threshold (operation 1004). If the difference is greater than a threshold, then a selected configuration is placed into a new group (operation 1006).

A determination is then made as to whether another unprocessed configuration is present (operation 1008). If another unprocessed configuration is present, the process returns to operation 1000.

Otherwise the process terminates. With reference again to operation 1004, if the difference is not greater than a threshold, the process proceeds to operation 1008. In other words, the configuration remains in the grouping and is not placed into a different grouping.

The result of this process may be two groups of configurations. One group is the original group of configurations in which the differences are not greater than the threshold. If one or more of the configurations is greater than the threshold, then those configurations are placed into a new group of configurations. This new group of configurations may be processed to determine whether they should stay in the same group or different groups depending on the particular implementation.

The selection of the threshold may be made a number different ways. For example, the threshold may be selected based on the maximum desired overlap or difference that is selected for different configurations of the vehicle.

The flowcharts and block diagrams in the different depicted embodiments illustrate the architecture, functionality, and operation of some possible implementations of apparatuses and methods in an illustrative embodiment. In this regard, each block in the flowcharts or block diagrams may represent at least one of a module, a segment, a function, or a portion of an operation or step. For example, one or more of the blocks may be implemented as program code, hardware, or a combination of the program code and hardware.

When implemented in hardware, the hardware may, for example, take the form of integrated circuits that are manufactured or configured to perform one or more operations in the flowcharts or block diagrams. When implemented as a combination of program code and hardware, the implementation may take the form of firmware. Each block in the flowcharts or the block diagrams may be implemented using special purpose hardware systems that perform the different operations or combinations of special purpose hardware and program code run by the special purpose hardware.

In some alternative implementations of an illustrative embodiment, the function or functions noted in the blocks may occur out of the order noted in the figures. For example, in some cases, two blocks shown in succession may be performed substantially concurrently, or the blocks may sometimes be performed in the reverse order, depending upon the functionality involved. Also, other blocks may be added in addition to the illustrated blocks in a flowchart or block diagram.

For example, the flowchart in FIG. 8 shows one illustrative example in which common parts and unique parts lists are maintained separately. In another illustrative example, separate lists may be present for each configuration that contain all of the common parts and unique parts for that configuration in the same list.

Figure 11:
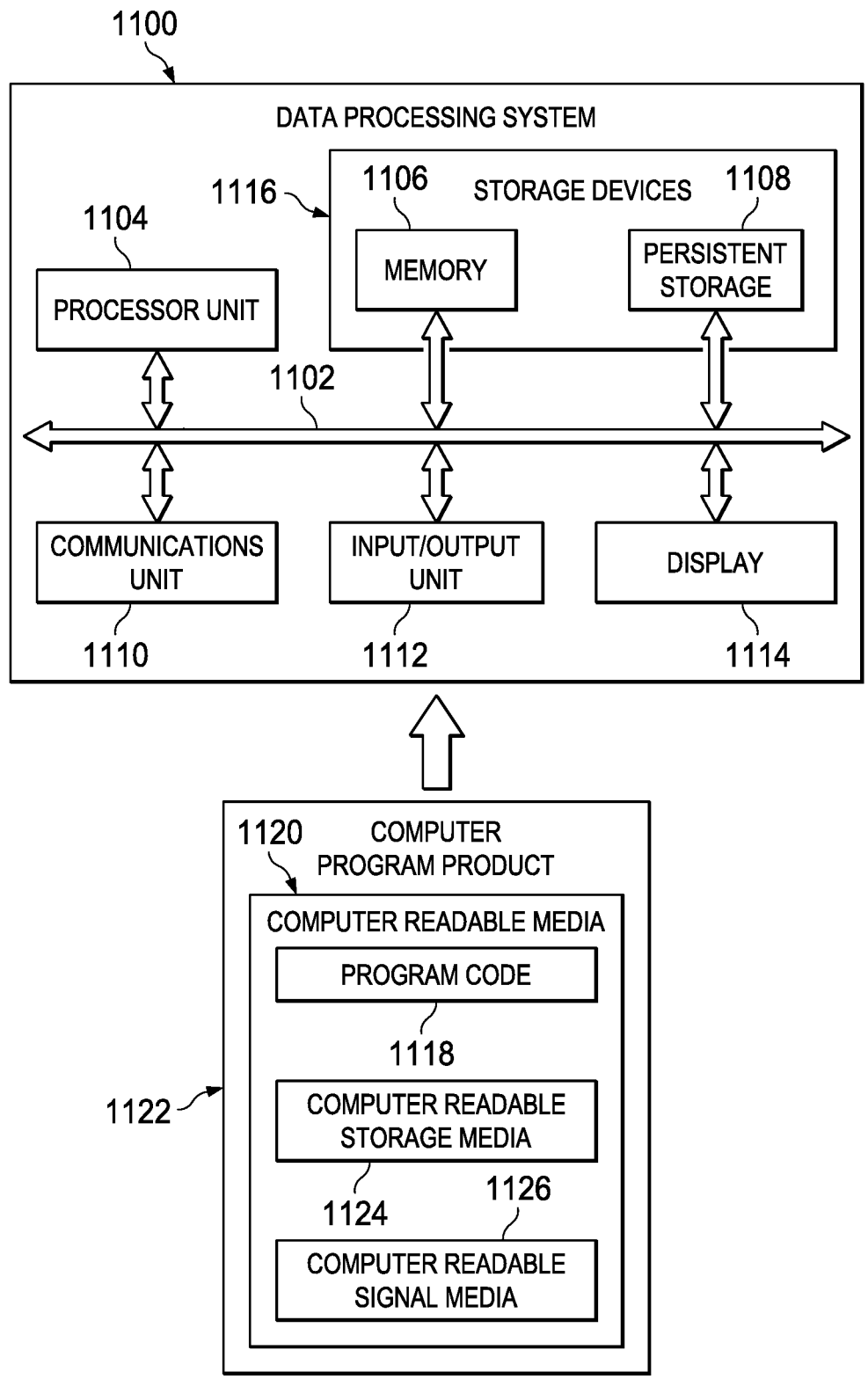
FIG. 11 is an illustration of a block diagram of a data processing system in accordance with an illustrative embodiment.

Turning now to FIG. 11, an illustration of a block diagram of a data processing system is depicted in accordance with an illustrative embodiment. Data processing system 1100 may be used to implement computer system 104. In this illustrative example, data processing system 1100 includes communications framework 1102, which provides communications between processor unit 1104, memory 1106, persistent storage 1108, communications unit 1110, input/output unit 1112, and display 1114. In this example, communications framework 1102 may take the form of a bus system.

Processor unit 1104 serves to execute instructions for software that may be loaded into memory 1106. Processor unit 1104 may be a number of processors, a multi-processor core, or some other type of processor, depending on the particular implementation.

Memory 1106 and persistent storage 1108 are examples of storage devices 1116. A storage device is any piece of hardware that is capable of storing information, such as, for example, without limitation, at least one of data, program code in functional form, or other suitable information either on a temporary basis, a permanent basis, or both on a temporary basis and a permanent basis. Storage devices 1116 may also be referred to as computer-readable storage devices in these illustrative examples. Memory 1106, in these examples, may be, for example, a random access memory or any other suitable volatile or non-volatile storage device. In some illustrative examples, memory 1106 may be persistent storage 1108.

Persistent storage 1108 may take various forms, depending on the particular implementation. For example, persistent storage 1108 may contain one or more components or devices. For example, persistent storage 1108 may be a hard drive, a solid state hard drive, a flash memory, a rewritable optical disk, a rewritable magnetic tape, or some combination of the above. The media used by persistent storage 1108 also may be removable. For example, a removable hard drive may be used for persistent storage 1108.

Communications unit 1110, in these illustrative examples, provides for communications with other data processing systems or devices. In these illustrative examples, communications unit 1110 is a network interface card.

Input/output unit 1112 allows for input and output of data with other devices that may be connected to data processing system 1100. For example, input/output unit 1112 may provide a connection for user input through at least one of a keyboard, a mouse, or some other suitable input device. Further, input/output unit 1112 may send output to a printer. Display 1114 provides a mechanism to display information to a user.

Instructions for at least one of the operating system, applications, or programs may be located in storage devices 1116, which are in communication with processor unit 1104 through communications framework 1102. The processes of the different embodiments may be performed by processor unit 1104 using computer-implemented instructions, which may be located in a memory, such as memory 1106.

These instructions are referred to as program code, computer-usable program code, or computer-readable program code that may be read and executed by a processor in processor unit 1104. The program code in the different embodiments may be embodied on different physical or computer-readable storage media, such as memory 1106 or persistent storage 1108.

Program code 1118 is located in a functional form on computer-readable media 1120 that is selectively removable and may be loaded onto or transferred to data processing system 1100 for execution by processor unit 1104. Program code 1118 and computer-readable media 1120 form computer program product 1122 in these illustrative examples. In one example, computer-readable media 1120 may be computer-readable storage media 1124 or computer-readable signal media 1126.

In these illustrative examples, computer-readable storage media 1124 is a physical or tangible storage device used to store program code 1118 rather than a medium that propagates or transmits program code 1118.

Alternatively, program code 1118 may be transferred to data processing system 1100 using computer-readable signal media 1126. Computer-readable signal media 1126 may be, for example, a propagated data signal containing program code 1118. For example, computer-readable signal media 1126 may be at least one of an electromagnetic signal, an optical signal, or any other suitable type of signal. These signals may be transmitted over at least one of communications links, such as wireless communications links, optical fiber cable, coaxial cable, a wire, or any other suitable type of communications link.

The different components illustrated for data processing system 1100 are not meant to provide architectural limitations to the manner in which different embodiments may be implemented. The different illustrative embodiments may be implemented in a data processing system including components, in addition to or in place of those illustrated, for data processing system 1100. Other components shown in FIG. 11 can be varied from the illustrative examples shown. The different embodiments may be implemented using any hardware device or system capable of running program code 1118.

Figure 12:
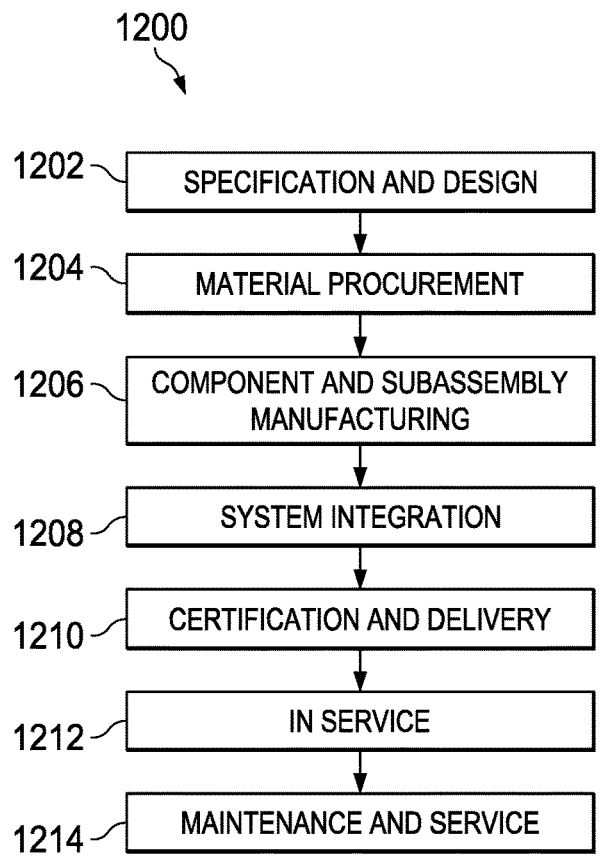
FIG. 12 is an illustration of a block diagram of an aircraft manufacturing and service method in accordance with an illustrative embodiment.
Figure 13:
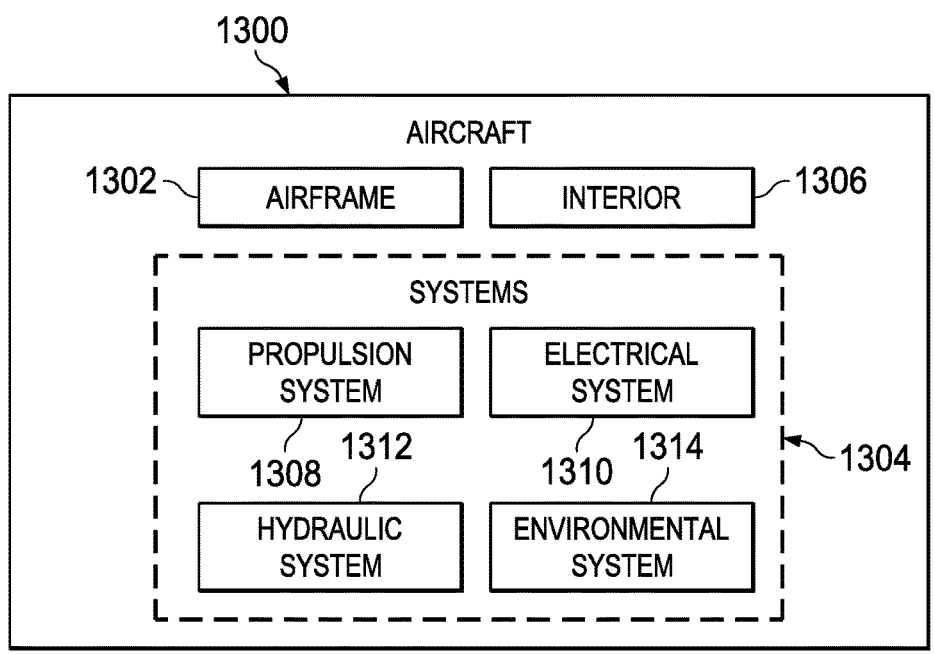
FIG. 13 is an illustration of a block diagram of an aircraft in which an illustrative embodiment may be implemented.

Illustrative embodiments of the disclosure may be described in the context of aircraft manufacturing and service method 1200 as shown in FIG. 12 and aircraft 1300 as shown in FIG. 13. Turning first to FIG. 12, an illustration of a block diagram of an aircraft manufacturing and service method is depicted in accordance with an illustrative embodiment. During pre-production, aircraft manufacturing and service method 1200 may include specification and design 1202 of aircraft 1300 in FIG. 13 and material procurement 1204.

During production, component and subassembly manufacturing 1206 and system integration 1208 of aircraft 1300 in FIG. 13 takes place. Thereafter, aircraft 1300 in FIG. 13 may go through certification and delivery 1210 in order to be placed in service 1212. While in service 1212 by a customer, aircraft 1300 in FIG. 13 is scheduled for routine maintenance and service 1214, which may include modification, reconfiguration, refurbishment, or other maintenance and service.

Each of the processes of aircraft manufacturing and service method 1200 may be performed or carried out by a system integrator, a third party, an operator, or some combination thereof. In these examples, the operator may be a customer. For the purposes of this description, a system integrator may include, without limitation, any number of aircraft manufacturers and major-system subcontractors; a third party may include, without limitation, any number of vendors, subcontractors, and suppliers; and an operator may be an airline, a leasing company, a military entity, a service organization, and so on.

With reference now to FIG. 13, an illustration of a block diagram of an aircraft is depicted in which an illustrative embodiment may be implemented. In this example, aircraft 1300 is produced by aircraft manufacturing and service method 1200 in FIG. 12 and may include airframe 1302 with plurality of systems 1304 and interior 1306. Examples of systems 1304 include one or more of propulsion system 1308, electrical system 1310, hydraulic system 1312, and environmental system 1314. Any number of other systems may be included. Although an aerospace example is shown, different illustrative embodiments may be applied to other industries, such as the automotive industry.

Apparatuses and methods embodied herein may be employed during at least one of the stages of aircraft manufacturing and service method 1200 in FIG. 12. For example, multi-configuration massive model system 108 in FIG. 1 may be used to display different configurations for aircraft 1300 during specification and design 1202 of aircraft 1300, component and subassembly manufacturing 1206, and system integration 1208. As another example, multi-configuration massive model system 108 also may be used to display different configurations of aircraft 1300 during routine maintenance and service 1214. For example, the display of the configurations may be used to plan or implement work orders for modification, reconfiguration, refurbishment, or other maintenance and service for aircraft 1300.

The use of a number of the different illustrative embodiments may substantially expedite the assembly of aircraft 1300, reduce the cost of aircraft 1300, or both expedite the assembly of aircraft 1300 and reduce the cost of aircraft 1300. The reduction in cost may be realized through reduced use of resources such as processor resources, bandwidth on networks, and memory or other storage space for massive model datasets generated by multi-configuration massive model system 108, in which this system enables using a single three-dimensional model dataset for multiple configurations of aircraft 1300.

Figure 14:
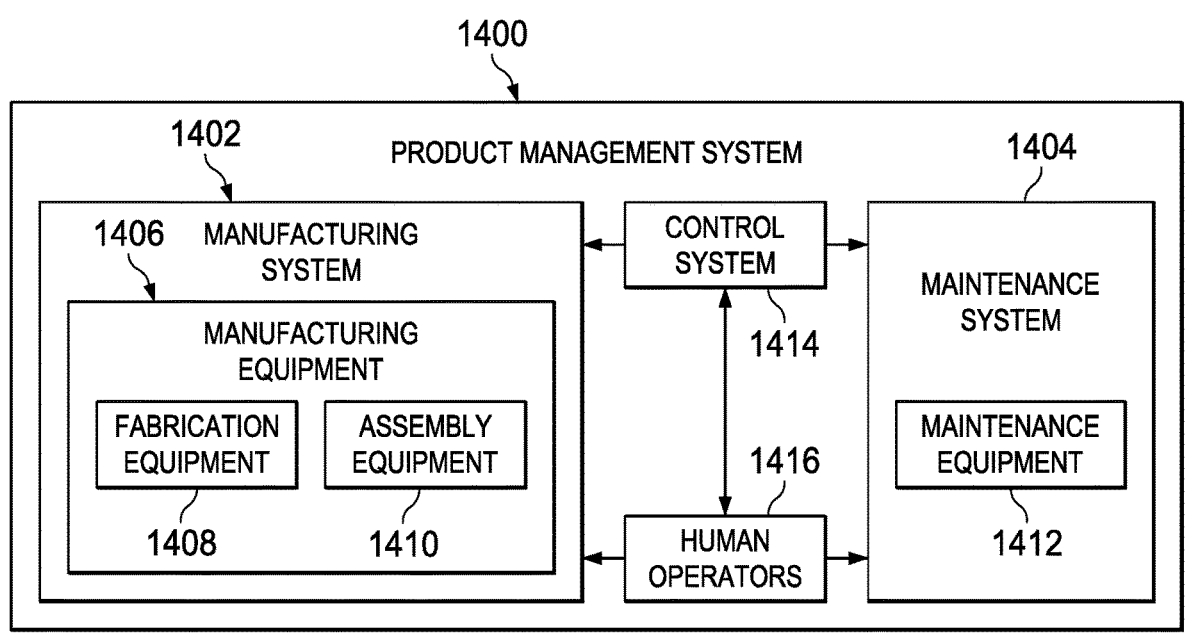
FIG. 14 is an illustration of a block diagram of a product management system in accordance with an illustrative embodiment.

Turning now to FIG. 14, an illustration of a block diagram of a product management system is depicted in accordance with an illustrative embodiment. Product management system 1400 is a physical hardware system. In this illustrative example, product management system 1400 may include at least one of manufacturing system 1402 or maintenance system 1404.

Manufacturing system 1402 is configured to manufacture products, such as aircraft 1300 in FIG. 13. As depicted, manufacturing system 1402 includes manufacturing equipment 1406. Manufacturing equipment 1406 includes at least one of fabrication equipment 1408 or assembly equipment 1410.

Fabrication equipment 1408 is equipment that may be used to fabricate components for parts used to form aircraft 1300. For example, fabrication equipment 1408 may include machines and tools. These machines and tools may be at least one of a drill, a hydraulic press, a furnace, a mold, a composite tape laying machine, a vacuum system, a lathe, or other suitable types of equipment. Fabrication equipment 1408 may be used to fabricate at least one of metal parts, composite parts, semiconductors, circuits, fasteners, ribs, skin panels, spars, antennas, or other suitable types of parts.

Assembly equipment 1410 is equipment used to assemble parts to form aircraft 1300. In particular, assembly equipment 1410 may be used to assemble components and parts to form aircraft 1300. Assembly equipment 1410 also may include machines and tools. These machines and tools may be at least one of a robotic arm, a crawler, a faster installation system, a rail-based drilling system, or a robot. Assembly equipment 1410 may be used to assemble parts such as seats, horizontal stabilizers, wings, engines, engine housings, landing gear systems, and other parts for aircraft 1300.

In this illustrative example, maintenance system 1404 includes maintenance equipment 1412. Maintenance equipment 1412 may include any equipment needed to perform maintenance on aircraft 1300. Maintenance equipment 1412 may include tools for performing different operations on parts on aircraft 1300. These operations may include at least one of disassembling parts, refurbishing parts, inspecting parts, reworking parts, manufacturing replacement parts, or other operations for performing maintenance on aircraft 1300. These operations may be for routine maintenance, inspections, upgrades, refurbishment, or other types of maintenance operations.

In the illustrative example, maintenance equipment 1412 may include ultrasonic inspection devices, x-ray imaging systems, vision systems, drills, crawlers, and other suitable device. In some cases, maintenance equipment 1412 may include fabrication equipment 1408, assembly equipment 1410, or both to produce and assemble parts that may be needed for maintenance.

Product management system 1400 also includes control system 1414. Control system 1414 is a hardware system and may also include software or other types of components. Control system 1414 is configured to control the operation of at least one of manufacturing system 1402 or maintenance system 1404. In particular, control system 1414 may control the operation of at least one of fabrication equipment 1408, assembly equipment 1410, or maintenance equipment 1412.

The hardware in control system 1414 may be using hardware that may include computers, circuits, networks, and other types of equipment. The control may take the form of direct control of manufacturing equipment 1406. For example, robots, computer-controlled machines, and other equipment may be controlled by control system 1414. In other illustrative examples, control system 1414 may manage operations performed by human operators 1416 in manufacturing or performing maintenance on aircraft 1300. For example, control system 1414 may assign tasks, provide instructions, display models, or perform other operations to manage operations performed by human operators 1416. In these illustrative examples, one or more components of multi-configuration massive model system 108 in FIG. 1 may be implemented in control system 1414 to manage at least one of the manufacturing or maintenance of aircraft 1300 in FIG. 13.

In the different illustrative examples, human operators 1416 may operate or interact with at least one of manufacturing equipment 1406, maintenance equipment 1412, or control system 1414. This interaction may be performed to manufacture aircraft 1300.

Of course, product management system 1400 may be configured to manage other products other than aircraft 1300. Although aircraft management system 1400 has been described with respect to manufacturing in the aerospace industry, product management system 1400 may be configured to manage products for other industries. For example, product management system 1400 may be configured to manufacture products for the automotive industry as well as any other suitable industries.

The illustrative embodiments provide one or more technical solutions to technical problems with the amount of resources needed to use massive model datasets. One or more technical solutions enables displaying multiple configurations of any vehicle without downloading or using multiple massive model datasets for the configurations.

The reduction in resources needed to generate information to display the configurations of the vehicle may be reduced greatly as the number of configurations increase. These savings may be, for example, fifty times the space savings and thirty times the processor resource savings, as compared to currently used techniques in which individual datasets are generated for each configuration. These types of savings may reduce the cost and time for design and manufacturing, as well as potential for reduced infrastructure costs associated with data storage. Further, the illustrative example in which multiple configurations are represented in a massive model dataset also may provide a way to identify custom groups or suppliers and customers of the manufacturer. In this manner, large groups of aircraft may be managed for customers using multi-configuration massive model system 108 in FIG. 1. Further, manufacturers may be able to more efficiently manage aircraft in at least one of different manufacturing lines or manufacturing locations using multi-configuration massive model system 108 in FIG. 1.

The description of the different illustrative embodiments has been presented for purposes of illustration and description and is not intended to be exhaustive or limited to the embodiments in the form disclosed. The different illustrative examples describe components that perform actions or operations. In an illustrative embodiment, a component may be configured to perform the action or operation described. For example, the component may have a configuration or design for a structure that provides the component an ability to perform the action or operation that is described in the illustrative examples as being performed by the component.

Many modifications and variations will be apparent to those of ordinary skill in the art. Further, different illustrative embodiments may provide different features as compared to other desirable embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. A massive model multi-configuration dataset system that comprises:
a processor unit;
a comparator configured to run on the processor unit, the comparator configured to compare sets of parts in separate massive model datasets for each configuration of two or more configurations of a vehicle to create a multi-configuration dataset that comprises a list that comprises: a group of common parts that are common to each of the two or more configurations, and for each of the two or more configurations, a group of unique parts that are unique, respectively, to each configuration of the two or more configurations, such that a storage requirement for the multi-configuration dataset is less than a combined storage requirement for all of the separate massive model datasets for the two or more configurations;
a memory configured to store the multi-configuration dataset that comprises common parts for the two or more configurations and unique parts for each configuration of the two or more configurations of the vehicle; and
a configuration manager configured to:
run on the processor unit;
receive input of a selected configuration for display;
reduce, compared to a transfer of data for the separate massive model datasets for each configuration, a bandwidth needed to transfer data from the memory, via a transfer of the multi-configuration dataset that comprises the common parts and the unique parts for each of the two or more configurations, to a display system that presents one of the two or more configurations of the vehicle; and
generate on the display system a three-dimensional visualization of the multi-configuration dataset that comprises the group of common parts for each of the two or more configurations displayed, and the unique parts that are unique to the selected configuration that are displayed on the display system.

2. The massive model multi-configuration dataset system of claim 1, further comprising the comparator configured to sequentially compare the group of common parts in the list to another configuration of the vehicle and update the list until all parts of the another configuration have been compared to update the group of common parts in the list.

3. The massive model multi-configuration dataset system of claim 2, further comprising the comparator configured to:
compare parts in the sets of parts in the separate massive model datasets for each configuration to the group of common parts in the list; and
create groups of unique parts that are unique to each of the configurations.

4. The massive model multi-configuration dataset system of claim 1, wherein the massive model multi-configuration dataset is a massive model multi-configuration dataset for the two or more configurations, and the selected configuration for display comprises a selection from among the two or more configurations divided into groups that display only the common parts and the unique parts for the selected configuration of the massive model multi-configuration dataset of the vehicle.

5. The massive model multi-configuration dataset system of claim 1, wherein the configurations are selected from at least one of a temporal configuration or a vehicle instance configuration.

6. The massive model multi-configuration dataset system of claim 1, wherein the configuration manager is configured to determine the group of common parts based on common part geometries among parts in the sets of parts, and a location definition identifying a location of each instance of common part geometries.

7. The massive model multi-configuration dataset system of claim 2, wherein, the configuration manager is configured to:
cause an action manager to receive a selection of a particular configuration for display from the two or more configurations; and
display the multi-configuration dataset that includes parts that are common to each of the configurations and the group of unique parts that are unique to the particular configuration of the vehicle and in an enabled state for display on the display system.

8. The massive model multi-configuration dataset system of claim 7, wherein the action manager is configured to generate the three-dimensional visualization including the group of common parts, and responsive to the selection of the particular configuration, the action manager includes in the three-dimensional visualization the group of unique parts for the selected configuration, such that the three-dimensional visualization of the selection is created without, at time of the selection, using from a plurality of different configuration datasets all of part models for all of the parts for the selected configuration to be loaded as needed for the three-dimensional visualization.

9. The massive model multi-configuration dataset system of claim 1, wherein the two or more configurations of the vehicle are associated with a same model type of vehicle, and the vehicle is selected from a group consisting of a mobile platform, an aircraft, an airplane, a rotorcraft, a surface ship, a tank, a personnel carrier, a train, a spacecraft, a submarine, a bus, and an automobile.

10. The massive model multi-configuration dataset system of claim 7, further comprising the action manager configured to:
receive a selected viewpoint;
using viewpoint information to determine which models of parts in the multi-configuration dataset will be displayed; and
display the massive model multi-configuration dataset that comprises:
the common parts that comprise viewpoint information corresponding to the selected viewpoint; and
the unique parts that comprise the viewpoint information corresponding to the selected viewpoint.

11. The massive model multi-configuration dataset system of claim 1, further comprising the configuration manager configured to move a part model from the group of common parts to a group of unique parts for a particular configuration based upon a change of a selected threshold that comprises a percentage difference for parts in the group of common parts.

12. A method for managing a massive model multi-configuration dataset, the method comprising:
comparing sets of parts in separate massive model datasets for each configuration of two or more configurations of a vehicle;
creating a multi-configuration dataset including a list comprising: a group of common parts that are common in each configuration of the two or more configurations of the vehicle, and for each of the two or more configurations, a group of unique parts that are unique, respectively, to each of the configurations of the vehicle, such that a storage requirement for the multi-configuration dataset is less than a combined storage requirement for all the separate massive model datasets for each of the two or more configurations;

receiving input of a selection of a particular configuration for display;

reducing, compared to transferring data for all the separate massive model datasets for each configuration, a bandwidth needed transferring data from storage, by transferring the multi-configuration dataset that includes common parts and unique parts for each of the two or more configurations, for use in displaying one of the two or more configurations of the vehicle; and generating a three-dimensional visualization, of the multi-configuration dataset, including the group of common parts for each of the two or more configurations that are displayed, and the unique parts that are unique to the particular configuration of the vehicle selected for displaying on a display system.

13. The method of claim 12, further comprising:
creating a common parts list of common parts from a comparison of parts in the two or more configurations; and
sequentially comparing the group of common parts on the list to another configuration in remaining configurations to be compared and updating the common parts list of common parts until all of the two or more configurations have been compared.

14. The method of claim 13, further comprising forming the list of the group of common parts and the group of unique parts via comparing parts for each configuration of the two or more configurations to the common parts list of common parts and creating the groups of unique parts that are unique to each configuration of the two or more configurations.

15. The method of claim 12, further comprising:
determining the group of common parts based on common part geometries for the parts in the separate massive model datasets for each configuration of the two or more configurations of the vehicle, and
a location definition identifying a location of each instance of common part geometries.

16. The method of claim 12, wherein the configurations are selected from at least one of a temporal configuration or a vehicle instance configuration.

17. The method of claim 12, wherein the two or more configurations are identified in a pre-defined list.

18. The method of claim 12, wherein displaying parts from the multi-configuration dataset of the selection of the particular configuration comprises displaying the group of common parts for each of the two or more configurations and the group of unique parts that are unique to the selection of the particular configuration and are in an enabled state for display on the display system.

19. The method of claim 12, further comprising:
generating the three-dimensional visualization including the group of common parts; and
responsive to selecting the particular configuration, including in the three-dimensional visualization the group of unique parts for the selection of the particular configuration, via creating the three-dimensional visualization of the selection of the particular configuration without, at a time of the selection, using from a plurality of different configuration datasets all part models for all of the parts for the selection of the particular configuration to be loaded as needed for the three-dimensional visualization.

20. The method of claim 12, wherein receiving an input of the selection of the configuration for display comprises placing the configurations into groups that are selectable for displaying only the common parts and the unique parts for the selection of the particular configuration of the massive model multi-configuration dataset of the vehicle.

21. The method of claim 18, further comprising an action manager in a multi-configuration massive model:
receiving a selected viewpoint;
using viewpoint information to determine which models of parts in the multi-configuration dataset will be displayed; and
displaying the massive model multi-configuration dataset comprising:
the common parts comprising viewpoint information corresponding to the selected viewpoint; and
the unique parts comprising the viewpoint information corresponding to the selected viewpoint.

22. The method of claim 12, further comprising a configuration manager:
receiving a change of a selected threshold comprising a percentage difference for parts in the group of common parts; and
using the change for moving a part model from the group of common parts to a group of unique parts for the particular configuration for display.

23. A product management system that comprises a control system configured to:
compare parts in separate massive model datasets for each configuration of two or more configurations of a vehicle to create a multi-configuration dataset including a list that comprises:
a group of common parts that are common to each of the two or more configurations based upon a comparison among parts in each configuration; and
for each configuration, a group of unique parts that are unique to each configuration of the two or more configurations, such that a combined storage requirement for the multi-configuration dataset is less than a storage requirement for all the separate massive model datasets for each of the two or more configurations;
receive input of a selection of a particular configuration of the vehicle for display;
reduce, compared to a transfer of data for all the separate massive model datasets for each configuration, a bandwidth needed to transfer data from a memory, by a transfer of the multi-configuration dataset that includes common parts and unique parts for each of the two or more configurations, for use in displaying one of the two or more configurations of the vehicle; and
generate on a display system a three-dimensional visualization of the multi-configuration dataset, including the group of common parts for each of the two or more configurations that are displayed, and the unique parts that are unique to the particular configuration of the vehicle selected for display that are displayed on the display system.

24. The product management system of claim 23, wherein the control system is configured to:
receive the selection of the particular configuration for display from the two or more configurations; and generate a three-dimensional visualization of the particular configuration of the vehicle, which includes the group of common parts for each of the two or more configurations and the group of unique parts that are unique to the selection of the particular configuration and are in an enabled state for display on the display system.

25. The product management system of claim 24, wherein the multi-configuration dataset is a massive model multi-configuration dataset for two or more configurations, and the selection of the particular configuration for display comprises a selection from among two or more configurations divided into groups that display only the common parts and the unique parts for the selection of the particular configuration of the massive model multi-configuration dataset of the vehicle.

26. The product management system of claim 24, wherein the control system is configured to generate the three-dimensional visualization including the group of common parts, and responsive to the selection of the particular configuration, the control system includes in the three-dimensional visualization the group of unique parts for the selection such that the three-dimensional visualization of the selection is created without, at time of the selection, using from a plurality of different configuration datasets all part models for all of the parts in the plurality of different configuration datasets for the selection to be loaded as needed for the three-dimensional visualization.

27. The product management system of claim 23, further comprising a configuration manager configured to move a part model from the group of common parts to the group of unique parts for the particular configuration for display based upon a change of a selected threshold that comprises a percentage difference for parts in the group of common parts.

* * * * *